(12) United States Patent
Guyader et al.

(10) Patent No.: US 9,685,475 B2
(45) Date of Patent: Jun. 20, 2017

(54) BACK-ILLUMINATED INTEGRATED IMAGING DEVICE WITH SIMPLIFIED INTERCONNECT ROUTING

(71) Applicant: STMicroelectronics (Crolles 2) SAS, Crolles (FR)

(72) Inventors: Francois Guyader, Montbonnot (FR); Jean-Pierre Oddou, Champagnier (FR); Stephane Allegret-Maret, Grenoble (FR); Mickael Gros-Jean, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/847,391

(22) Filed: Sep. 8, 2015

(65) Prior Publication Data
US 2016/0099278 A1 Apr. 7, 2016

(30) Foreign Application Priority Data
Oct. 6, 2014 (FR) .................................... 14 59541

(51) Int. Cl.
*H01L 31/18* (2006.01)
*H01L 31/0232* (2014.01)
*H01L 27/146* (2006.01)
*H01L 27/12* (2006.01)

(52) U.S. Cl.
CPC .... *H01L 27/14636* (2013.01); *H01L 27/1203* (2013.01); *H01L 27/1462* (2013.01); *H01L 27/1463* (2013.01); *H01L 27/1464* (2013.01); *H01L 27/14623* (2013.01); *H01L 27/14629* (2013.01)

(58) Field of Classification Search
CPC ............. H01L 31/0216; H01L 31/0232; H01L 31/054; H01L 31/041; H01L 31/0236; H01L 27/14636; H01L 27/14629; H01L 27/1203; H01L 27/1462; H01L 27/14623
See application file for complete search history.

(56) References Cited

U.S. PATENT DOCUMENTS

| 2007/0284685 A1* | 12/2007 | Tanaka ...................... G02B 6/43 257/432 |
| 2011/0181749 A1* | 7/2011 | Yamada .............. H01L 27/1461 348/222.1 |
| 2014/0291481 A1 | 10/2014 | Zhang et al. |

OTHER PUBLICATIONS

INPI Search Report and Written Opinion for FR 1459541 mailed Jun. 15, 2015 (12 pages).

(Continued)

*Primary Examiner* — Benjamin Sandvik
*Assistant Examiner* — Damon Hillman
(74) *Attorney, Agent, or Firm* — Gardere Wynne Sewell LLP

(57) ABSTRACT

A back-illuminated integrated imaging device is formed from a semiconductor substrate including a zone of pixels bounded by capacitive deep trench isolations. A peripheral zone is located outside the zone of pixels. A continuous electrically conductive layer forms, in the zone of pixels, an electrode in a trench for each capacitive deep trench isolation, and forms, in the peripheral zone, a redistribution layer for electrically coupling the electrode to a biasing contact pad. The electrode is located in the trench between a trench dielectric and at least one material for filling the trench.

36 Claims, 3 Drawing Sheets

(56) References Cited

OTHER PUBLICATIONS

Kitamura, Y. et al: "Suppression of Crosstalk by Using Backside Deep Trench Isolation for 1.12 μm Backside Illuminated CMOS Image Sensor," 2012 IEEE, p. 24.2.1-24.2.4.

\* cited by examiner

BACK-ILLUMINATED INTEGRATED IMAGING DEVICE WITH SIMPLIFIED INTERCONNECT ROUTING

PRIORITY CLAIM

This application claims priority from French Application for Patent No. 1459541 filed Oct. 6, 2014, the disclosure of which is incorporated by reference.

TECHNICAL FIELD

Embodiments of the invention relate to back-side illuminated integrated imaging devices, or imagers, and more particularly to the simplification of the routing of the interconnect(s) between the electrodes located in the capacitive deep trench isolations of pixels and the contact pad or pads intended to receive a voltage for biasing these electrodes.

BACKGROUND

An image sensor generally comprises a zone of useful pixels, i.e. a zone of pixels that are intended to be effectively illuminated, and electronics for controlling these pixels. The pixels and the control electronics are produced in a semiconductor substrate, for example a substrate made of silicon. Image sensors, or "imagers" may be front-illuminated or back-illuminated.

In front-illuminated image sensors, the pixels are illuminated via the front side of the substrate, i.e. the side bearing in particular the interconnect part (commonly referred to as the back end of line (BEOL) part by those skilled in the art).

In contrast, in a back-illuminated image sensor, the pixels are illuminated via the back side of the substrate, i.e. the side opposite the front side.

Moreover, the pixels are generally bounded by deep trench isolations (DTIs) the aim of which is to ensure electrical and optical isolation between the pixels so as to decrease or even prevent crosstalk between adjacent pixels. It will be recalled here that crosstalk is a parasitic signal that originates from a neighboring pixel and that interferes with the signal from the pixel in question. Crosstalk may have an optical and electrical component.

An article by Kitamura et al. entitled "Suppression of Crosstalk by Using Backside Deep Trench Isolation for 1.12 µm Backside Illuminated CMOS Image Sensor", IEEE 2012 (incorporated by reference), demonstrated that using capacitive deep trench isolations allowed crosstalk to be significantly decreased in back-illuminated image sensors.

In this article, the capacitive deep trench isolations were filled with metal by deposition then chemical mechanical planarization (CMP) so that the metal/dielectric/silicon structure behaved as a capacitor allowing holes to be accumulated around the trench by applying a negative biasing voltage to the filling metal of the trench, thereby decreasing degradation due to dark current.

This being so, this article by Kitamura et al. does not mention the means in the image sensor allowing each of the capacitive trenches to be electrically connected to the biasing voltage. However, this aspect is of importance when designing the image sensor, especially because of the presence of control logic around the zone of pixels.

SUMMARY

According to one embodiment, a back-illuminated image sensor is provided comprising capacitive deep trench isolations connected simply to at least one contact pad intended to receive a voltage for biasing these capacitive trenches, without interfering with the layout of the control logic.

According to one embodiment, a back-illuminated image sensor having an improved quantum efficiency (i.e. the ratio of the number of electronic charges collected to the number of incident photons) is also provided.

According to one aspect, a back-illuminated integrated imaging device is provided, said device comprising a semiconductor substrate and a zone of useful pixels bounded by capacitive deep trench isolations housed in the semiconductor substrate.

According to one general feature of this aspect, the device comprises a peripheral zone located outside said zone of useful pixels (this peripheral zone for example containing the control logic and generally one or more reference pixels intended not to be illuminated), contact pads, and a continuous electrically conductive layer configured to at least form, in said zone of useful pixels, an electrode in each capacitive deep trench isolation, and, in said peripheral zone, a redistribution layer electrically coupled on the one hand to all the electrodes and on the other hand at least to one contact pad intended to receive a voltage for biasing all said electrodes, said electrode being located in the corresponding capacitive trench between a trench dielectric and at least one material for filling said electrically insulating trench.

Thus, the routing of the interconnect between the electrodes and said at least one contact pad intended to receive the biasing voltage is simplified because it is achieved via a continuous electrically conductive layer that has two functions, namely on the one hand a function forming capacitive trench electrodes, and on the other hand a function as a redistribution layer electrically coupled to the contact pad. Thus, there is in particular no need to produce trenches (intended to contain an electrical conduit forming this interconnect) liable to interfere with the volume occupied by the control electronics.

Moreover, the fact that the electrodes of the capacitive trenches are formed by an electrically conductive layer and not by completely filling the trench with a metal, as in the aforementioned article by Kitamura, simplifies image sensor fabrication, especially because it makes chemical mechanical planarization (CMP) steps, and their inherent delamination risks, redundant, and because it is perfectly compatible with the conventional fabrication steps used in CMOS processes.

Moreover, the continuous and electrically conductive layer is advantageously metallic, thereby making compatibility with CMOS manufacturing processes possible by allowing low thermal budgets, typically below 400° C., to be met.

Furthermore, the continuous electrically conductive layer acts as a "light guide", in particular when it comprises titanium nitride, thereby increasing quantum efficiency.

Lastly, the filling material of the trench allows, especially when it comprises silicon nitride ($Si_3N_4$), the trench to be passivated and in particular penetration of moisture into the latter to be prevented.

According to one embodiment, the device furthermore comprises at least one electrically conductive via, for example made of aluminum, making contact with said redistribution layer, this via being electrically coupled to said at least one contact pad.

According to one embodiment, the device furthermore comprises an electrically conductive and optically opaque terminal layer, typically made of aluminum, located above the peripheral zone, making contact with said at least one via, and an electrically conductive connection connecting said terminal layer and said at least one contact pad.

This terminal layer, typically made of aluminum, which covers the peripheral zone, thus makes it possible to ensure electrical contact between the via and the contact pad that is intended to receive the voltage for biasing the electrodes, and also provides an optical function in the sense that it allows reference pixels that are intended not to be illuminated to be hidden.

According to one embodiment, the continuous electrically conductive layer furthermore forms a continuous grid on the edges of the openings of the trenches and comprises a lateral extension forming said redistribution layer, connected to the grid and extending from at least the opening of a trench located on the periphery of said zone of useful pixels as far as said peripheral zone.

This lateral extension may for example form a continuous peripheral ring around the grid. Furthermore, in this case, said at least one, advantageously ring-shaped, via may make contact with said lateral extension.

The continuous and electrically conductive layer comprises at least one material chosen from the group formed by titanium, titanium nitride, tungsten and aluminum.

A plurality of variants are possible for such an image sensor, especially as regards the composition of the trench dielectric and of an antireflection layer.

More precisely, according to a first variant, the device comprises an antireflection layer containing silicon oxide and silicon nitride, said layer being located above the substrate outside the trenches. Specifically, the substrate used for the image sensor may be a silicon-on-insulator (SOI) substrate comprising a buried electrically insulating layer commonly designated a "BOX" by those skilled in the art. Furthermore, this buried insulating layer may comprise a silicon oxide/silicon nitride/silicon oxide sandwich. The antireflection layer used in this variant therefore results from this buried insulating layer (BOX).

Moreover, in this first variant the device comprises at least one dielectric underlayer extending into the trenches under the continuous electrically conductive layer and outside the trenches between the antireflection layer and the continuous electrically conductive layer, said at least one dielectric underlayer forming, in each trench, said trench dielectric. Such a dielectric layer may for example comprise silicon dioxide.

According to another variant, which is especially obtained by removing the buried insulating layer (BOX) beforehand, or by using a bulk silicon substrate, the device comprises a dielectric, preferably having a high relative electrical permittivity $\in_r$ or dielectric constant K (typically a permittivity $\in_r$ higher than or equal to 15), including a material holding negative fixed charges, which material is located on the walls of the trenches and outside the trenches above the substrate, and an antireflection layer located at least partially above the high electrical permittivity dielectric, said high electrical permittivity dielectric forming, in each trench, said trench dielectric.

Thus, in this variant, the dielectric, owing to the presence of the material holding negative fixed charges, extending not only into the trenches but also above the substrate, makes it possible to attract holes, or to empty interface states generating parasitic electrons, thereby contributing to decreasing dark current.

A high dielectric constant, although not essential, is advantageous because a high dielectric constant makes it possible to create more charge (capacitive effect) and also to increase the surface potential of the silicon (continuity of the dielectric vector), thereby allowing the interface states generating parasitic electrons to be emptied.

Furthermore, it becomes possible in this variant to provide an antireflection layer of higher quality than the BOX layer used in the preceding variant, especially when the antireflection layer comprises tantalum oxide.

The preferably high dielectric constant dielectric may comprise an oxide layer, thus making it possible to obtain a high-quality interface, covered with the material holding negative fixed charges, which may for example be chosen from the group formed by $HfO_2$, $ZrO_2$ and $Al_2O_3$ or an alloy of these three oxides.

BRIEF DESCRIPTION OF THE DRAWINGS

Other advantages and features of the invention will become apparent on examining the detailed description of completely non-limiting embodiments and the appended drawings, in which.

DETAILED DESCRIPTION

Figure 1:
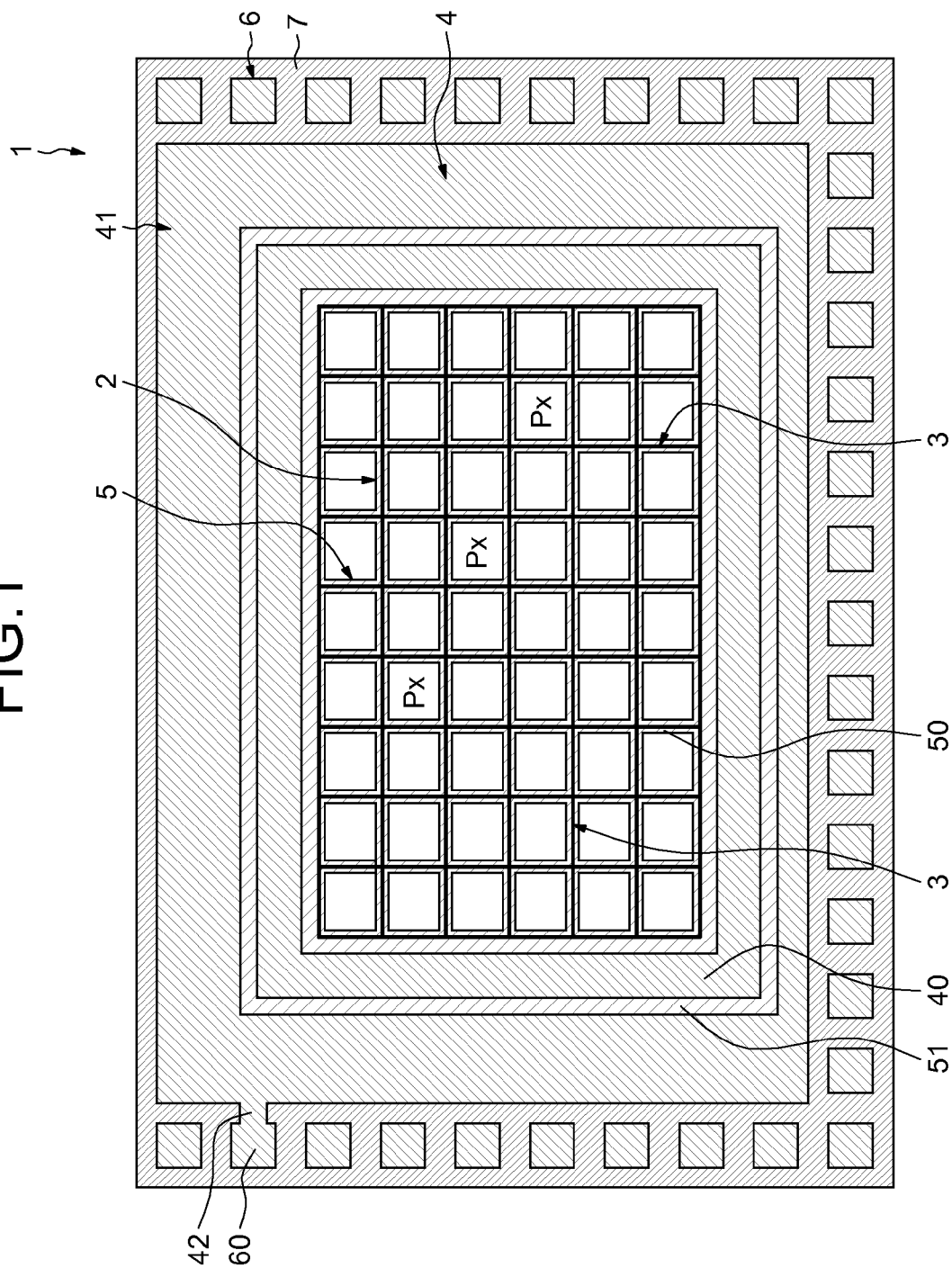
FIGS. 1 to 3 schematically illustrate various embodiments of an integrated imaging device.

FIG. 1 is an exploded schematic view of the back side of the imaging device, illustrating various levels of the sensor, certain of these levels having been deliberately shown for the sake of clarity even though in practice they would be covered by other levels.

In FIG. 1, the reference 1 designates a back-illuminated image sensor comprising a zone 2 of useful pixels PX bounded by capacitive deep trench isolations 3 housed in a semiconductor substrate, for example a substrate made of silicon.

The sensor also comprises, outside the zone 2 of useful pixels PX, a peripheral zone 4 in particular generally incorporating reference pixels and control logic for controlling the various pixels.

The useful pixels PX are the pixels intended to be effectively illuminated whereas the reference pixels are pixels intended not to be illuminated, especially in order to determine offsets due to dark currents.

The device 1 also comprises contact pads 6 at least one of which, here a contact pad 60, is intended to receive a biasing voltage, typically a negative biasing voltage, for example -1 volt. As will be seen in greater detail below, this biasing voltage is intended to bias the electrodes of the capacitive deep trench isolations.

In this respect, the device also comprises a continuous electrically conductive layer 5, for example made of titanium nitride or indeed of titanium/titanium nitride, configured to form, in the zone 2 of useful pixels, an electrode in each capacitive deep trench isolation, and to form, in the peripheral zone 4, a redistribution layer 51 that is electrically coupled, on the one hand, to all the electrodes, and, on the other hand, to the contact pad 60 intended to receive the voltage for biasing all the electrodes.

As may be seen in this figure, the continuous electrically conductive layer 5 forms a continuous grid 50 on the edges of the openings of the trenches and comprises a lateral extension 51 here forming a continuous peripheral ring around the grid 50 and forming said redistribution layer. This peripheral lateral ring is connected to the grid 50 and extends from the openings of the trenches 3 located on the periphery of the zone 2 of useful pixels.

Making contact with this peripheral lateral extension 51 is placed a peripheral ring-shaped via 40 that is for example made of aluminum.

The device also comprises an electrically conductive and optically opaque terminal layer 41 connected to the contact pad 60 by an electrically conductive conduit 42, also made of aluminum.

This terminal layer 41 is located above the redistribution layer 51 and the peripheral via 40 to which it makes contact, although this overlap has not been shown for the sake of clarity in FIG. 1, as indicated above.

Thus, there is indeed an electrical connection between the contact pad 60 and all of the electrodes of the capacitive trenches that it will therefore be possible to bias with the biasing voltage applied to the contact pad 60.

Figure 2:
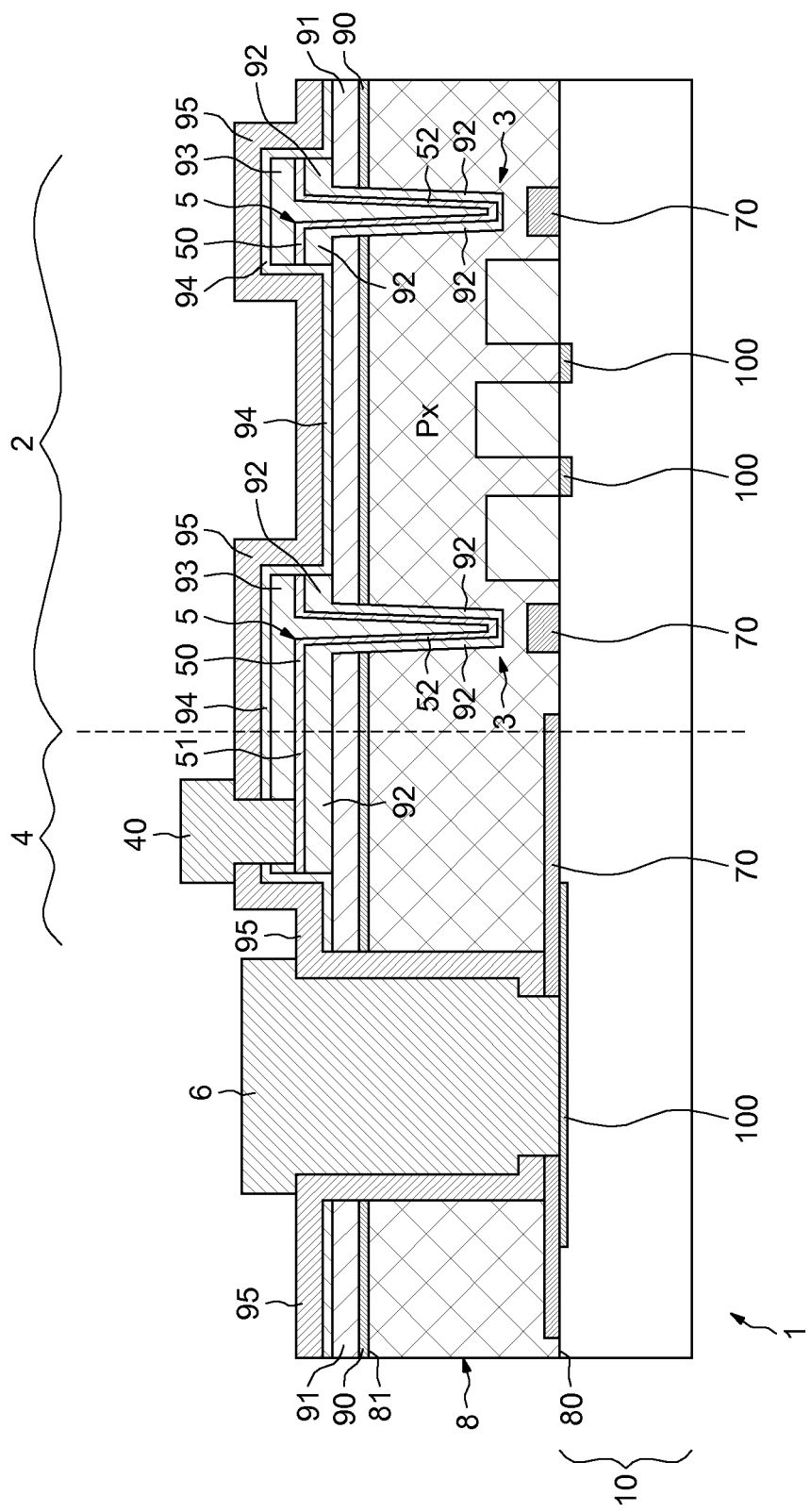

Reference will now more particularly be made to FIG. 2, which schematically illustrates a partial cross-sectional view of the device in FIG. 1.

In this figure, the reference 8 designates the semiconductor substrate in which the zone 2 of useful pixels is located.

This substrate comprises a front side 80 bearing, as is conventional in the art, an interconnect part 10 commonly designated the BEOL part by those skilled in the art, and a back side 81 opposite the front side 80.

For the sake of simplicity, only a few metal tracks 100 of the first metallization level of the interconnect part 10 of the sensor have been schematically shown in FIG. 2.

A useful pixel PX is bounded by a capacitive deep trench isolation 3 and active zones of various components of the pixel (such as transistors, photodiodes, etc.) have been schematically shown laterally isolated by isolation zones 70, for example shallow trench isolation (STI) zones.

The back side 81 of the substrate 8 is here covered with an antireflection layer comprising a layer 90 of silicon dioxide and a layer 91 of silicon nitride $Si_3N_4$, these two layers resulting from the buried insulating layer BOX of the substrate 8 that was initially a silicon-on-insulator substrate.

Each trench 3 comprises a trench dielectric 92, here comprising, for example, a layer of silicon dioxide having a thickness of about ten nm, extended, outside the trenches 3 above the layer 91 of silicon nitride, by thicker portions, typically about 200 nm in thickness, and resulting from the formation, during the fabrication process, of a hard mask.

On this dielectric layer 92 rests the continuous electrically conductive layer 5, for example here made of titanium nitride TiN. As will be seen in greater detail below, the geometry of the continuous electrically conductive layer 5 results from a deposition and a partial removal in a conventional mask transfer process.

This continuous electrical layer thus comprises a portion 52 located in the trenches 3 and, outside the trenches, a portion 50 covering the oxide layer 92. The portion 50 is extended, as regards the peripheral trenches, by the lateral extension 51 forming the redistribution layer.

The trenches are filled with a filling material 93, for example silicon nitride $Si_3N_4$. This filling material also covers the portions 50 of the continuous electrically conductive layer 5 and, if needs be, the redistribution layer 51.

In this example embodiment, the trenches have for example a height of about 2 microns with an opening of about 0.2 microns.

The thickness of the continuous electrically conductive layer 5 made of titanium nitride is about 70 nm, and the thickness of the filling layer 93 may be comprised between 150 and 300 nm.

This set of layers is covered with a layer 94 made of silicon nitride SiN particularly rich in silicon, this layer 94 itself being covered with a layer 95 of TEOS oxide for example having a thickness of about 200 nm.

The peripheral via 40, for example made of aluminum, passes through the layers 93, 94 and 95 in order to make contact with the redistribution layer 51.

The contact pads 6 pass through the layers 90, 91, 94 and 95 in order to make contact with the first metallization level 100 of the BEOL part 10 of the integrated circuit. Thus, the contact pad 60, which will be electrically coupled to the peripheral via 40, will receive the voltage for biasing the electrodes of the capacitive trenches by way of the BEOL part of the integrated circuit.

The device in FIG. 2 is produced by conventional CMOS fabrication process steps.

More precisely, after the various transistors of the integrated circuit and the BEOL part 10 have been produced, the hard mask layer 92 is formed on the silicon nitride layer 91 and then deep trenches are produced in the substrate 8.

Next, the trench dielectric is produced by carrying out in succession a low-temperature plasma oxidization followed by a conformal oxide deposition.

Next, in the trenches and on the hard mask layer 92, the continuous electrically conductive layer 5 is formed by carrying out, in succession, for example, a conformal deposition, such as an atomic layer deposition (ALD), so as to obtain a thickness of about 5 to 10 nm, followed by a plasma enhanced vapor deposition so as to increase the thickness to about 70 nm.

Next the trenches are filled with the filling material 93, then the geometry (grid+lateral extension) of the electrically conductive layer 5 is defined, by an aligned conventional photolithography step, on the trenches, and the filling material 93, the continuous electrically conductive layer 5 and the hard mask layer 92 are etched.

Next, the layer 94 of silicon nitride rich in silicon is deposited on the structure thus obtained and the orifices of the future contact pads 6 are produced.

Next, the TEOS oxide 95 is deposited on the structure thus obtained. Next, the orifice of the peripheral via 40 opening onto the redistribution layer 51 is produced.

Lastly, after having carried out an additional etch of the bottom of the orifice of the contact pad so as to reach the metallization level 100, these contact pads 6 and the peripheral via 40 are formed by filling the corresponding orifices with aluminum.

Figure 3:
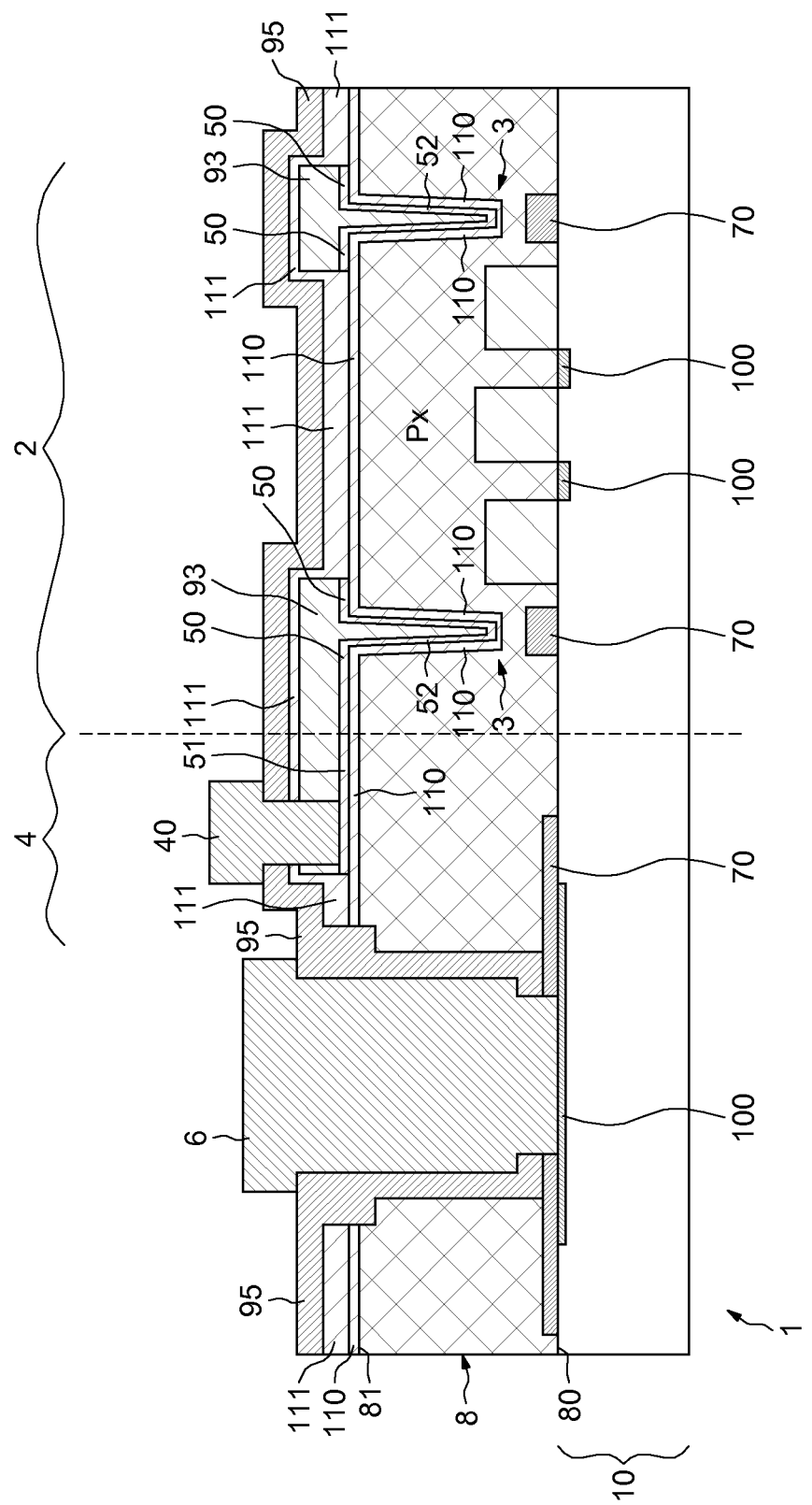

FIG. 3 illustrates a variant embodiment of the device in FIG. 1.

For the sake of simplicity, only differences between FIG. 2 and FIG. 3 will now be described.

In this embodiment, the antireflection layer 90, 91 in FIG. 2 is removed and the trench dielectric is this time a dielectric 110 having a high dielectric constant K (typically a K higher than or equal to 15).

This trench dielectric also covers the parts of the substrate located outside the trenches 3.

The dielectric 110 here comprises an oxide layer covered with a material holding negative fixed charges, for example hafnium dioxide $HfO_2$.

The silicon dioxide allows a high-quality interface to be obtained with the silicon of the substrate whereas the material holding negative fixed charges allows holes to be attracted during operation of the image sensor, thereby making it possible to decrease dark current.

As in the variant in FIG. 2, the continuous and electrically conductive layer 5 covers, in appropriate locations, the gate dielectric 110 (portions 50, 51 and 52) directly. The trenches are once more filled with filling material 93 that also covers the portions 50 and 51 of the continuous electrically conductive layer made of titanium nitride.

In this variant embodiment, an antireflection layer 111, of higher quality than the antireflection layer of the device in FIG. 2, for example containing tantalum oxide, covers the filling material 93 and, between the trenches, the gate dielectric 110 directly.

This set of layers is covered with the TEOS oxide layer 95.

Here again, the device in FIG. 3 is obtained by conventional CMOS fabrication process steps.

More precisely, after the silicon oxide/silicon nitride/silicon oxide stack forming the buried insulating layer (BOX) of the SOI substrate has been removed from the back side 81 of the substrate 8, a layer of silicon oxide forming a hard mask is deposited so as to make it possible to produce the trenches in the silicon.

Next, after this hard mask has been removed, the layer of silicon dioxide is deposited covering the walls of the trenches and the back side of the substrate. This layer typically has a thickness of about 2 nm.

Next, the layer of material holding a negative charge is deposited, the thickness of this layer typically being about 6 to 7 nm.

Next, analogously to what was described above, the continuous layer of titanium nitride is formed and, on the structure thus obtained, the layer of filling material 93 is deposited. Next, the geometry of the continuous and electrically conductive layer is defined and this layer is then etched so as to form the grid around the trenches and the redistribution layer.

Next, the antireflection layer made of tantalum oxide is deposited and the rest of the process is carried out in an analogous way to that described with reference to FIG. 2.

The aspect according to which the continuous electrically conductive layer 5 serves on the one hand to form the electrodes of the capacitive trenches, and on the other hand to electrically connect these trenches to the contact pad, is particularly advantageous in the embodiment illustrated in FIG. 3.

Specifically, in the prior-art embodiments of capacitive deep trench isolations, such as those described in the aforementioned article by Kitamura, the chemical mechanical planarization (CMP) required to remove, from the back side of the wafer, the metal that served to fill the trenches, unavoidably damages the layers of materials deposited immediately under this metal. Thus, if provision were made to deposit under the filling metal a layer of a dielectric material holding negative fixed charges, in order to decrease the dark current of the pixels, this layer would be damaged, or even completely removed, during the chemical mechanical planarization (CMP) of the filling metal of the trenches, on the surface of the pixels. Only the portions of dielectric material holding negative fixed charges located in the trenches would not be removed.

In the embodiment illustrated in FIG. 3, in contrast, it is possible to remove those portions of the continuous electrically conductive layer 5 that must be removed without damaging the layer of dielectric material holding negative fixed charges 110. To do this, it is possible to use an etch chemistry that etches the continuous electrically conductive layer 5 very selectively relative to the layer of dielectric material holding negative fixed charges 110. In the example in which the material of the layer 5 is titanium nitride (TiN) and the dielectric material of the layer 110 is hafnium dioxide $HfO_2$, it is possible to etch the first layer relative to the second by making use of a wet etch with a chemistry of the type known by those skilled in the art as the "Standard Clean 1", or more simply "SC1" ($NH_4OH:H_2O_2:H_2O$) or with a chemistry of the type known by those skilled in the art as the SPM chemistry ($H_2SO_4: H_2O_2$), with a selectivity higher than 100.

Other chemistries containing oxidizing agents ($H_2O_2$ or $O_3$ (ozone)) may also be suitable.

Such a selectivity is difficult to achieve with chemical mechanical planarization (CMP). Thus, in the embodiment in FIG. 3, it is possible to preserve a high-quality dielectric layer 110 over the entire area of the pixels.

The invention claimed is:

1. A back-illuminated integrated imaging device, comprising:
    a semiconductor substrate including a back side and a front side;
    a zone of pixels, configured to be illuminated from the back side of the semiconductor substrate, bounded by capacitive deep trench isolations formed in trenches located in the semiconductor substrate and extending into the back side of the semiconductor substrate;
    a peripheral zone located outside said zone of pixels;
    contact pads at the back side of the semiconductor substrate including a biasing contact pad; and
    a continuous electrically conductive layer configured to form, in said zone of pixels, an electrode in each capacitive deep trench isolation, and to form, in said peripheral zone, a redistribution layer at the back side of the semiconductor substrate electrically coupled to the electrode in each capacitive deep trench isolation and electrically coupled to said biasing contact pad for applying a voltage for biasing said electrode in each capacitive deep trench isolation;
    wherein said electrode in each capacitive deep trench isolation is located between a trench dielectric and at least one material for filling said trenches.

2. The device according to claim 1, further comprising at least one electrically conductive via making contact with said redistribution layer and electrically coupled to said biasing contact pad.

3. The device according to claim 2, further comprising:
    an electrically conductive and optically opaque terminal layer located above said peripheral zone at the back side of the semiconductor substrate, said terminal layer making contact with said at least one electrically conductive via; and
    an electrically conductive connection connecting said terminal layer and said biasing contact pad.

4. The device according to claim 1, wherein the continuous electrically conductive layer further forms a continuous grid at edges of the trenches at the back side of the semiconductor substrate, and wherein the continuous electrically conductive layer comprises a lateral extension connected to the continuous grid so as to form said redistribution layer and extending from at least one of the trenches located at a periphery of said zone of pixels to said peripheral zone.

5. The device according to claim 4, wherein the lateral extension forms a continuous peripheral ring around the continuous grid.

6. The device according to claim 4, further comprising at least one electrically conductive via making contact with said redistribution layer and electrically coupled to said biasing contact pad, and wherein said at least one electrically conductive via makes contact with said lateral extension.

7. The device according to claim 1, wherein said continuous electrically conductive layer comprises at least one material chosen from the group consisting of titanium, titanium nitride, tungsten and aluminum.

8. The device according to claim 1, further comprising:
an antireflection layer, containing silicon oxide and silicon nitride, located above the substrate outside the trenches at the back side of the semiconductor substrate; and
at least one dielectric underlayer extending into the trenches under the continuous electrically conductive layer and outside the trenches between the antireflection layer and the continuous electrically conductive layer, said at least one dielectric underlayer forming, in each trench, said trench dielectric.

9. The device according to claim 8, wherein said at least one material for filling said trenches is located, in the trenches and outside the trenches, above the continuous electrically conductive layer.

10. The device according to claim 1, further comprising:
a dielectric including a material containing negative fixed charges located on walls of the trenches and outside the trenches above the substrate; and
an antireflection layer located at least partially above the dielectric, said dielectric forming, in each trench, said trench dielectric.

11. The device according to claim 10, wherein the dielectric is a dielectric having a dielectric constant greater than or equal to 15.

12. The device according to claim 10, wherein said at least one material for filling said trenches is located, in the trenches and outside the trenches, above the continuous electrically conductive layer, said antireflection layer also being located above the at least one material for filling said trenches.

13. The device according to claim 10, wherein the dielectric comprises an oxide layer covered with the material containing negative fixed charges.

14. The device according to claim 10, wherein the material containing negative fixed charges is selected from the group consisting of $HfO_2$, $ZrO_2$ and $Al_2O_3$ or an alloy of two or more of $HfO_2$, $ZrO_2$ and $Al_2O_3$.

15. The device according to claim 10, wherein the antireflection layer comprises tantalum oxide.

16. A back-illuminated integrated imaging device, comprising:
a semiconductor substrate including a back side and a front side;
a capacitive deep trench isolation formed in a trench located in the semiconductor substrate and extending into the back side of the semiconductor substrate, said trench surrounding a pixel region configured to be illuminated from the back side of the semiconductor substrate;
a peripheral zone located outside said pixel region;
contact pads including a biasing contact pad; and
an electrically conductive layer including a first layer portion extending in the trench of the capacitive deep trench isolation to form an electrode and a second portion in the peripheral zone forming a redistribution layer at the back side of the semiconductor substrate that is electrically connected to the biasing contact pad;
wherein said electrode in each capacitive deep trench isolation is located between a trench dielectric and at least one material for filling said trenches.

17. The device according to claim 16, wherein the electrically conductive layer further forms a grid at edges of the trenches.

18. The device according to claim 17, wherein the electrically conductive layer comprises a lateral extension forming a continuous peripheral ring around the grid.

19. The device according to claim 16, wherein said electrically conductive layer is formed of a material selected from the group consisting of titanium, titanium nitride, tungsten and aluminum.

20. The device according to claim 16, further comprising:
an antireflection layer located above the substrate outside the trench at the back side of the semiconductor substrate; and
at least one dielectric underlayer extending into the trench under the continuous electrically conductive layer and outside the trench between the antireflection layer and the continuous electrically conductive layer.

21. The device according to claim 16, further comprising:
a dielectric including a material containing negative fixed charges located on walls of the trench and outside the trench above the substrate, said dielectric forming, in each trench, said trench dielectric; and
an antireflection layer located at least partially above the dielectric.

22. The device according to claim 21, wherein the dielectric comprises an oxide layer covered with the material containing negative fixed charges.

23. The device according to claim 21, wherein the material containing negative fixed charges is selected from the group consisting of $HfO_2$, $ZrO_2$ and $Al_2O_3$ or an alloy of two or more of $HfO_2$, $ZrO_2$ and $Al_2O_3$.

24. A back-illuminated integrated imaging device, comprising:
a semiconductor substrate;
a zone of pixels bounded by capacitive deep trench isolations formed in trenches located in the semiconductor substrate;
a peripheral zone located outside said zone of pixels;
contact pads including a biasing contact pad; and
a continuous electrically conductive layer configured to form, in said zone of pixels, an electrode in each capacitive deep trench isolation, and to form, in said peripheral zone, a redistribution layer electrically coupled to the electrode in each capacitive deep trench isolation and electrically coupled to said biasing contact pad for applying a voltage for biasing said electrode in each capacitive deep trench isolation;
wherein said electrode in each capacitive deep trench isolation is located between a trench dielectric and at least one material for filling said trenches; and
wherein the continuous electrically conductive layer further forms a continuous grid at edges of the trenches, and wherein the continuous electrically conductive layer comprises a lateral extension connected to the continuous grid so as to form said redistribution layer and extending from at least one of the trenches located at a periphery of said zone of pixels to said peripheral zone.

25. The device according to claim 24, wherein the lateral extension forms a continuous peripheral ring around the continuous grid.

26. The device according to claim 24, further comprising at least one electrically conductive via making contact with said redistribution layer and electrically coupled to said biasing contact pad, and wherein said at least one electrically conductive via makes contact with said lateral extension.

27. A back-illuminated integrated imaging device, comprising:
a semiconductor substrate;

a zone of pixels bounded by capacitive deep trench isolations formed in trenches located in the semiconductor substrate;

a peripheral zone located outside said zone of pixels;

contact pads including a biasing contact pad;

a continuous electrically conductive layer configured to form, in said zone of pixels, an electrode in each capacitive deep trench isolation, and to form, in said peripheral zone, a redistribution layer electrically coupled to the electrode in each capacitive deep trench isolation and electrically coupled to said biasing contact pad for applying a voltage for biasing said electrode in each capacitive deep trench isolation;

wherein said electrode in each capacitive deep trench isolation is located between a trench dielectric and at least one material for filling said trenches;

a dielectric including a material containing negative fixed charges located on walls of the trenches and outside the trenches above the substrate; and an antireflection layer located at least partially above the dielectric, said dielectric forming, in each trench, said trench dielectric.

28. The device according to claim 27, wherein the dielectric is a dielectric having a dielectric constant greater than or equal to 15.

29. The device according to claim 27, wherein said at least one material for filling said trenches is located, in the trenches and outside the trenches, above the continuous electrically conductive layer, said antireflection layer also being located above the at least one material for filling said trenches.

30. The device according to claim 27, wherein the dielectric comprises an oxide layer covered with the material containing negative fixed charges.

31. The device according to claim 27, wherein the material containing negative fixed charges is selected from the group consisting of $HfO_2$, $ZrO_2$ and $Al_2O_3$ or an alloy of two or more of $HfO_2$, $ZrO_2$ and $Al_2O_3$.

32. The device according to claim 27, wherein the antireflection layer comprises tantalum oxide.

33. A back-illuminated integrated imaging device, comprising:

a semiconductor substrate;

a capacitive deep trench isolation formed in a trenches located in the semiconductor substrate and surrounding a pixel region;

a peripheral zone located outside said pixel region;

contact pads including a biasing contact pad;

an electrically conductive layer including a first layer portion extending in the trench of the capacitive deep trench isolation to form an electrode and a second portion in the peripheral zone forming a redistribution layer that is electrically connected to the biasing contact pad;

wherein said electrode in each capacitive deep trench isolation is located between a trench dielectric and at least one material for filling said trenches;

a dielectric including a material containing negative fixed charges located on walls of the trench and outside the trench above the substrate, said dielectric forming, in each trench, said trench dielectric; and an antireflection layer located at least partially above the dielectric.

34. The device according to claim 33, wherein the dielectric comprises an oxide layer covered with the material containing negative fixed charges.

35. The device according to claim 33, wherein the material containing negative fixed charges is selected from the group consisting of $HfO_2$, $ZrO_2$ and $Al_2O_3$ or an alloy of two or more of $HfO_2$, $ZrO_2$ and $Al_2O_3$.

36. A back-illuminated integrated imaging device, comprising:

a semiconductor substrate;

a capacitive deep trench isolation formed in a trenches located in the semiconductor substrate and surrounding a pixel region;

a peripheral zone located outside said pixel region;

contact pads including a biasing contact pad;

an electrically conductive layer including a first layer portion extending in the trench of the capacitive deep trench isolation to form an electrode and a second portion in the peripheral zone forming a redistribution layer that is electrically connected to the biasing contact pad;

wherein said electrode in each capacitive deep trench isolation is located between a trench dielectric and at least one material for filling said trenches;

an antireflection layer located above the substrate outside the trench; and at least one dielectric underlayer extending into the trench under the continuous electrically conductive layer and outside the trench between the antireflection layer and the continuous electrically conductive layer.

* * * * *